United States Patent [19]
Matsumura

[11] Patent Number: 5,733,133
[45] Date of Patent: Mar. 31, 1998

[54] PIN SOCKET CONNECTOR FOR PRINT CIRCUIT BOARD

[75] Inventor: Shigeru Matsumura, Menuma-machi, Japan

[73] Assignee: Advantest Corp., Tokyo, Japan

[21] Appl. No.: 631,972

[22] Filed: Apr. 15, 1996

[30] Foreign Application Priority Data

Apr. 14, 1995 [JP] Japan ..................... 7-113939

[51] Int. Cl.⁶ ..................... H01R 9/09
[52] U.S. Cl. ..................... 439/82; 439/853
[58] Field of Search ..................... 439/82, 80, 81, 439/83, 84, 853

[56] References Cited

U.S. PATENT DOCUMENTS 3,218,606  11/1965  Schultz ..................... 439/82
3,654,583  4/1972  Mancini ..................... 439/82

Primary Examiner—Neil Abrams
Assistant Examiner—T. C. Patel
Attorney, Agent, or Firm—Muramatsu & Associates

[57] ABSTRACT

A pin socket connector to be mounted on a print circuit board which forms an IC device interface for testing an IC device has an improved productivity and mounting density while maintaining an air tight sealing. The pin socket connector includes: a bottom member having an outer diameter larger than an inner diameter of a through hole of a print circuit board; a through hole contact provided over the bottom member and having an outer diameter equal to or smaller than the inner diameter of the through hole; and a contact spring provided over the through hole contact and having a plurality of electrically conductive springs to receive a contact pin therein.

5 Claims, 4 Drawing Sheets

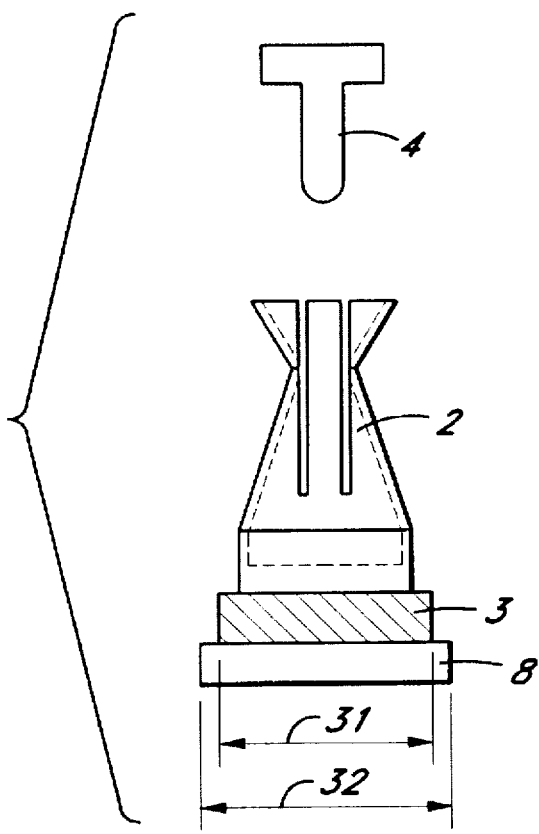
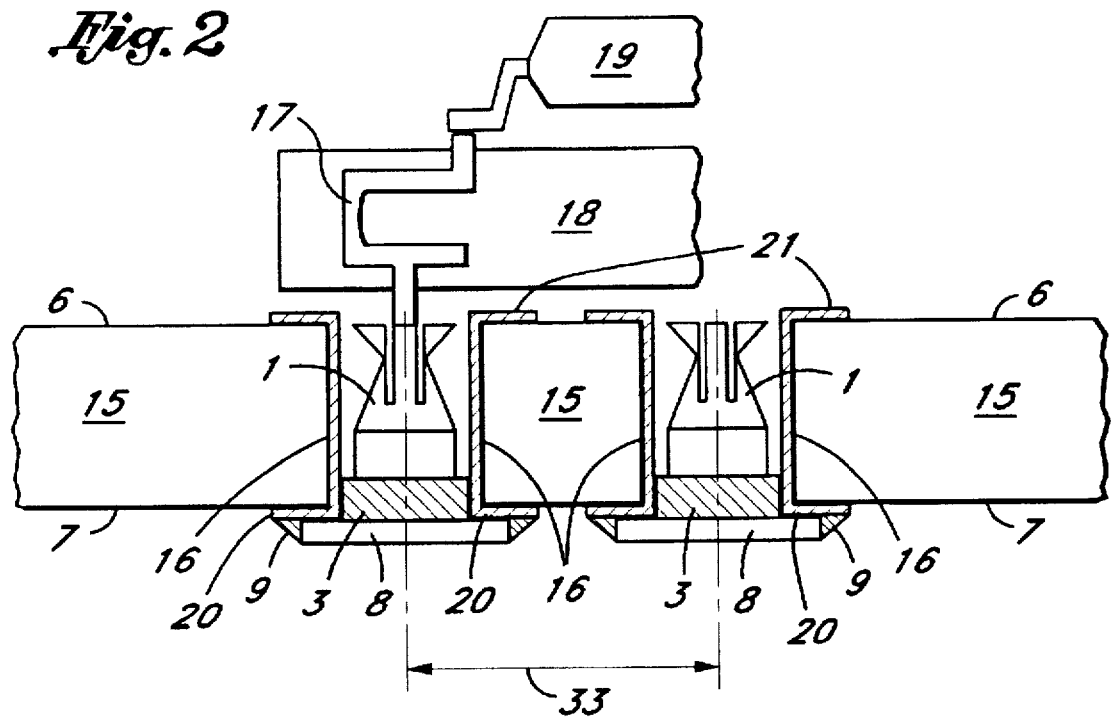

PIN SOCKET CONNECTOR FOR PRINT CIRCUIT BOARD

FIELD OF INVENTION

This invention relates to a pin socket connector to be mounted on a print circuit board which forms an IC device interface, and more particularly, to a pin socket connector to be mounted in a through hole of a print circuit board to receive an IC socket contact pin to test an IC device by an IC tester.

BACKGROUND OF THE INVENTION

In testing an IC device by an IC tester, an IC device to be tested is placed on an IC device interface which interfaces the IC device with an IC tester. Through the IC device interface, the IC device to be tested receives, at appropriate input pins, test signals from the IC tester and the resulting output signals from the IC device are transmitted through the IC device interface and evaluated by the IC tester.

FIG. 4 is a cross sectional view showing an example of structure of a conventional IC device interface used in an IC tester. In FIG. 4, an IC device 19 that is to be tested is connected to one ends of contact pins 17 of an IC socket 18. The other ends of the contact pins 17 are inserted in pin socket connectors 13 attached to through holes 16 of a print circuit board 15. The print circuit board 15 is electrically connected to the IC tester via printed wiring (not shown) for transmitting test signals from the IC tester and device output signals to the IC tester.

Thus, each pin of the IC device is electrically connected to a corresponding test circuit of the IC tester through the contact pin 17 of the IC socket 18, the pin socket connector 13 and the print circuit board 15. Since the IC devices have different functions, sizes, shapes and numbers of pins, combinations of the IC sockets and the print circuit board varies depending on the kinds of IC devices to be tested.

The through hole 16 is typically a circularly cylindrical electric conductive hole passing through the print circuit board. The through hole 16 usually has an upper land 21 and a lower land 20 other than a cylindrical body for securing a mechanical strength and an electrical connection with the print circuit board. The upper land 21 and the lower land 20 are respectively fixed to an upper surface 6 and a lower surface 7 of the print circuit board 15 as shown in FIG. 4.

FIG. 5 shows an example of a pin socket connector 13 used in the IC device interface of FIG. 4. The pin socket connector 13 is formed of a body 10, an inner contact 11 and a sleeve 12. When mounted on the print circuit board 15, as shown in FIG. 4, the body 10 is inserted in the through hole 16 until the sleeve 12 is restricted by the upper land 21 on the upper surface of the print circuit board 15. Then, the body 10 of the connector 13 is fixed to the lower land 20 of the through hole 16 by solder 14.

The conventional pin socket connector 13 shown in FIGS. 4 and 5, when used in an IC device interface for an IC tester, has a disadvantage in that the size of the IC device interface becomes large since the pin socket connector 13 has the sleeve 12 and the inner contact 11. This is because the sleeve 12 has to occupy a certain area of the surface A of the print circuit board 15 to secure the mechanical strength to support the inner contact 11 in the through hole 16.

To increase the mounting density of the pin socket connectors on the print circuit board, it is necessary to decrease the sizes of the sleeve 12 and the inner contact 11. However, such decrease of size is limited in such a structure of the pin socket connector 13 which has to be pressed in the through hole 16 of the print circuit board 15. In other words, even though the upper land 21 of the print circuit board can be minimized, the sleeve needs to have a certain degree of diameter and thickness sufficient to attain a mechanical strength to support the inner contact 11. Thus, the sleeve 12 of the pin socket connector 13 causes a difficulty to improve the mounting density of the IC device interface.

The other disadvantage involved in the conventional pin socket connector is that the working efficiency for mounting or assembling the pin socket connectors 13 on the print circuit board 15 cannot be sufficiently improved. This is because a lower portion of the body 10 has to be soldered with the lower land 20 of the through hole 16.

The other example of a conventional IC device interface used in an IC tester is shown in FIG. 6. In this example, the sleeve 12 of the pin socket connector 13 in FIGS. 4 and 5 is eliminated to increase the density of connectors on the print circuit board. Thus, only the inner contact 11 is attached to the inner wall of the through hole 16.

However, in this example of FIG. 6, in addition to the problem that an enough mechanical strength to support the inner contact 11 in the through hole 16 is difficult to obtain, the following problem arises. Since the inner contact 11 is not gas-tightly sealed, i.e., there exists a gap in the inner contact 11, the air on the upper surface 6 of the print circuit board 15 may leak through the gap to the lower surface 7. In testing IC devices by an IC tester, it is a common procedure to set up a specific environmental condition such as temperature or humidity around the IC devices to be tested. Thus, if there is a gas leak in the pin socket connector in FIG. 6, the environmental condition of the IC devices will be changed and will not be able to maintain such condition constant. In other words, the environmental test for the IC devices is not effective in this IC device interface since the environmental condition changes in a relatively short period of time.

As in the foregoing, the conventional IC device interface has the disadvantage which makes the cost high because of the production efficiency is difficult to improve. Other disadvantage is that the mounting density is limited by the sleeve of the pin socket connector used in the IC device interface. The sleeve of the pin socket connector further causes a difficulty in making the overall IC device interface thinner since the sleeve needs certain thickness. Further, the other conventional example has the disadvantage in which the environmental test for the IC devices may not be properly performed because of the air leakage through the pin socket connector.

SUMMARY OF THE INVENTION

It is, therefore, an objective of the present invention to provide a pin socket connector for an IC device interface for testing IC devices which is capable of decreasing the size and thus increasing a mounting density of connectors on the print circuit board of the IC device interface.

It is another object of the present invention to provide a pin socket connector for an IC device interface which is capable of improving the productivity and thus decreasing the production cost of the IC device interface.

It is a further object of the present invention to provide a pin socket connector for an IC device interface which is capable of gas-tightly seal the through holes of the print circuit board of the IC device interface so that the environmental test for the IC devices can be properly performed without an air leakage.

It is a further object of the present invention to provide a pin socket connector for an IC device interface which is capable of obviating a sleeve of the conventional pin socket connector so that the length of the pin socket connector is decreased which decreases an overall height of the IC device interface.

In order to achieve the above objective, the pin socket connector of the present invention has eliminated the sleeve included in the conventional technology while assuring the air tight sealing between the upper surface and the lower surface of the print circuit board.

Namely, the pin socket connector of the present invention is formed of: a bottom member having an outer diameter larger than an inner diameter of a through hole of a print circuit board; a through hole contact provided over the bottom member and having an outer diameter equal to or smaller than the inner diameter of the through hole; and a contact spring provided over the through hole contact and having a plurality of electrically conductive springs to receive a contact pin therein.

According to the present invention, the pin socket connector for IC device interface for testing the IC devices is capable of decreasing the size and thus increasing a mounting density of connectors on the print circuit board of the IC device interface. Thus, it has become possible for testing a high density IC device having a small pitch between the lead pins.

Further, since the pin socket connector of the present invention obviates the sleeve of the conventional pin socket connector, the length of the pin socket connector is decreased which decreases an overall height, i.e., thickness of the IC device interface. Furthermore, the pin socket connector of the present invention improves the productivity and thus decreasing the production cost of the IC device interface because the procedure for mounting the pin socket connectors on the print circuit board is simple and easy.

Moreover, when mounted on the print circuit board, the pin socket connector of the present invention is able to establish a gas-tight seal for the through holes of the print circuit board of the IC device interface so that the environmental test for the IC devices can be properly performed without the air leakage.

BRIEF DESCRIPTION OF THE DRAWINGS

FIG. 1 is a front view showing a first embodiment of pin socket connector of the present invention.

FIG. 2 is a cross sectional view of an IC device interface having the pin socket connectors of the present invention shown in FIG. 1.

DETAILED DESCRIPTION OF THE PREFERRED EMBODIMENT

Figure 3:
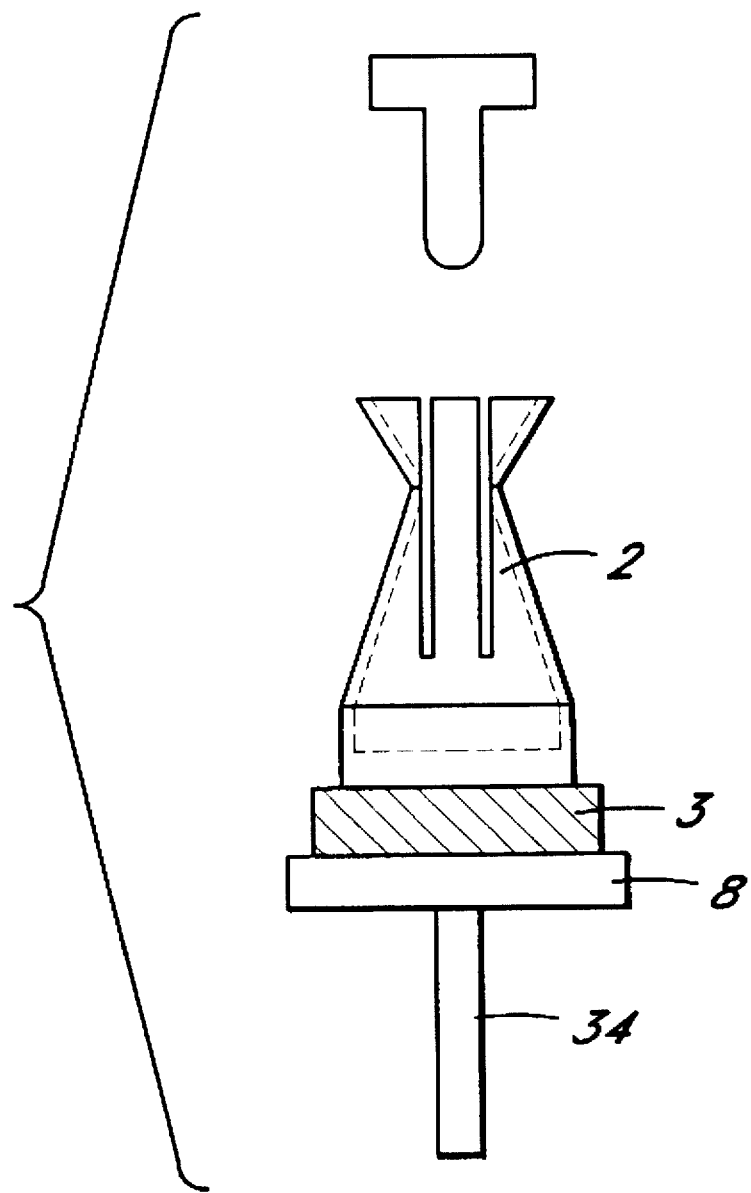
FIG. 3 is a front view showing a second embodiment of pin socket connector of the present invention.
Figure 4:
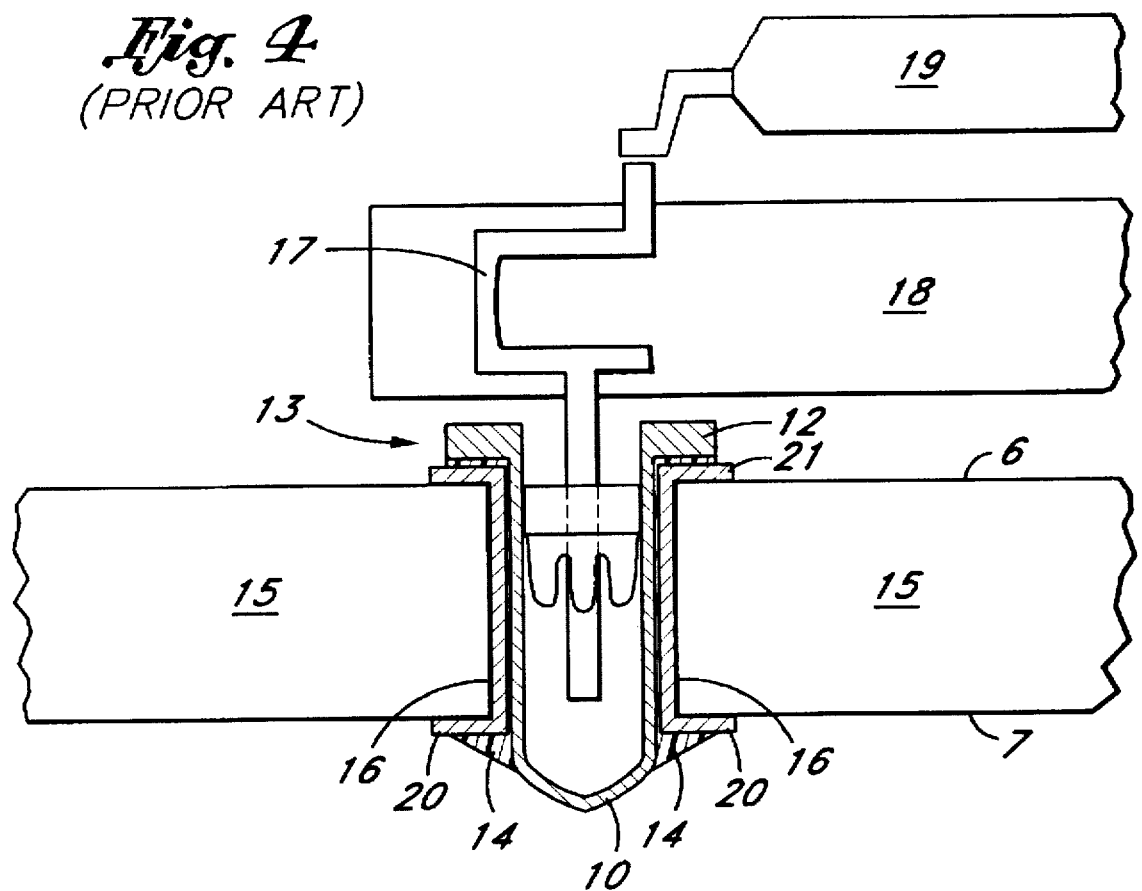
FIG. 4 is a cross sectional view of an IC device interface having conventional pin socket connectors.
Figure 5:
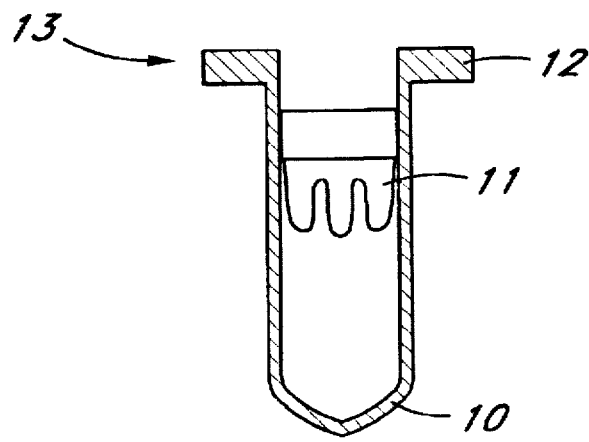
FIG. 5 is a cross sectional view of the conventional pin socket connector.
Figure 6:
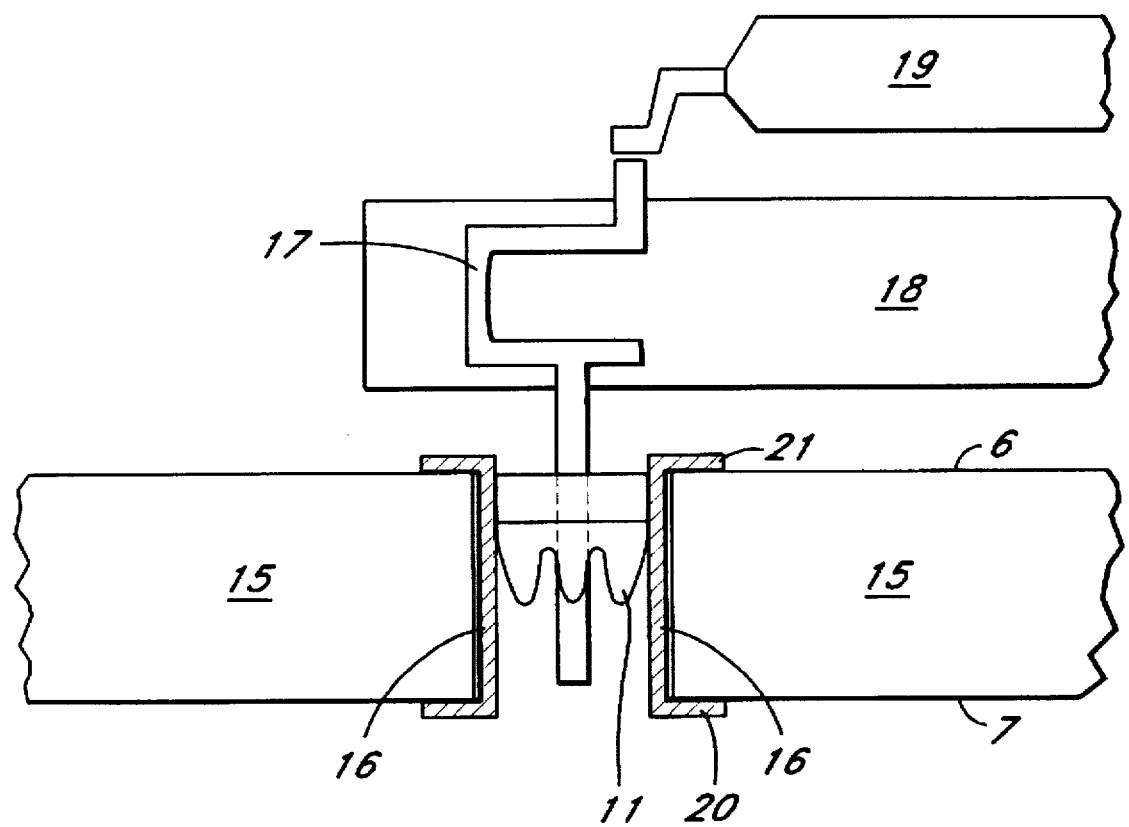
FIG. 6 is a cross sectional view showing another example of the conventional pin socket connector.

FIG. 1 is a front view of the pin socket connector of the first embodiment of the present invention. FIG. 2 is a cross sectional view of an IC device interface having the pin socket connectors of the present invention of FIG. 1. The pin socket connector has a bottom member 8, a through hole contact 3 and a contact spring 2. The through hole contact 3 and the bottom member 8 have a disk like shape although other shapes may be also possible.

The bottom member 8 has a diameter which is slightly larger than that of a through hole 16 of a print circuit board 15 so that the bottom member 8 mechanically and electrically contacts with a lower land 20 of the through hole 16. The bottom member 8 is fixed to the lower land 20 via solder 9.

The through hole contact 3 has a slightly smaller diameter than the bottom member 8 to be electrically contact with a through hole 16 of a print circuit board 15. For example, the diameter of the bottom member 8 is about 0.9 mm while the diameter of the through hole contact 3 is about 0.6 mm as shown in FIG. 1.

The contact spring 2 is formed of two or more electrically conductive springs to receive a male pin 4 (FIG. 1) or a contact pin 17 (FIG. 2) of an IC socket therebetween. Each of the conductive springs has a sufficient spring force to secure the electric contact between the male pin 4 or the contact pin 17 and the contact spring 2.

As shown in FIG. 2, the contact pins are pressed in the through holes 16 from the bottom of the print circuit board 15. The outer surface of the through hole contact 3 contacts with the inner wall of the through hole 16 to attain the electric contact. Thus, it is preferable that the outer shape and diameter of the through hole contact 3 be the same as the inner shape and diameter of the through hole 16. The solder 9 further improve the electrical contact between the pin socket connector and the through hole 16 as well as to provide an enough mechanical strength to endure the stress caused by repeated insertions of the contact pin 17 in the contact spring 2.

The solder 9 also contributes to improve a gas-tight sealing between the upper surface and the lower surface of the print circuit board 15. Although the bottom member 8 may be sufficient to prevent the air flow via the through hole 16, the solder 9 will make such air sealing perfect. Thus, the air flow through the through holes 16 will not occur in the IC device interface of the present invention. Thus, the environmental conditions such as a high temperature for the IC device 19 that is to be tested can be maintained in the upper side of the print circuit board 15.

FIG. 3 shows another embodiment of the present invention. In the example of FIG. 3, a terminal pin 34 is provided under the bottom member 8. The terminal pin 34 is useful for electrically connecting with other circuit such as a measuring system. The other usage of the terminal pin 34 is to contact a probe of a measuring instrument such as an oscilloscope or a multimeter. It is also possible to use the terminal pin 34 as a wrapping terminal where a wire is wrapped around to establish an electrical connection for the IC tester circuit.

In the foregoing examples, the outer shape of the through hole contact 3 can be circular, rectangular or other shapes. For example, the rectangular shape of the through hole contact 3 may be effective for a circular shape through hole 16 since the corners of the rectangular rigidly contact with the inner wall of the through hole, which realizes a firm and effective electrical contact. Although the soldering is preferable, it is also possible to press in the bottom member 8 into the lower land 20 of the through hole 16 without using the solder 9.

In the above examples, the length of the male pin 4 or the contact pin 17 is equal to or shorter than the length of the contact spring 2. In case where the length of the male pin 4 or the contact pin 17 is longer than the contact spring 2, center surfaces of the base of the contact spring 2 and the through hole contact 3 may provided with holes or grooves to receive the pins 4 or 17. If necessary, a groove also may be provided on the upper surface of the bottom member 8 when the pins 4 or 17 exceed the thickness of the print circuit board 15. Even in this situation, the air sealing of the pin socket connector is maintained by the bottom member 8 to effectuate the environmental test of the IC devices.

In the present invention, the contact spring 2, the through hole contact 3 and the bottom member 8 may be integrally formed. Alternatively, the contact spring 2 may be separately formed while the through hole contact 3 and the bottom 8 are integrally made, and contact spring 2 is fixed later on the through hole contact 3. It is also possible to make these components separately in three pieces and assemble them thereafter.

As has been foregoing, according to the present invention, the pin socket connector for IC device interface for testing the IC devices is capable of decreasing the size and thus increasing the mounting density of connectors on the print circuit board of the IC device interface. Thus, it has become possible for testing a high density IC device having a small pitch between the lead pins.

Further, since the pin socket connector of the present invention obviates the sleeve of the conventional pin socket connector, the length of the pin socket connector is decreased which decreases an overall height of the IC device interface. Furthermore, the pin socket connector of the present invention improves the productivity and thus decreasing the production cost of the IC device interface because the procedure for mounting the pin socket connectors on the print circuit board is simple and easy.

Moreover, when mounted on the print circuit board, the pin socket connector of the present invention is able to establish a gas-tight seal for the through holes of the print circuit board of the IC device interface so that the environmental test for the IC devices can be properly performed without the air leakage.

What is claimed is:

1. A pin socket connector to be mounted on a printed circuit board to receive an IC socket, comprising:

a bottom member having an outer diameter larger than an inner diameter of a through hole of a printed circuit board, said bottom member is gas-tightly sealed to a lower land of said through hole by soldering, and said through hole being electrically connecting between an upper surface and a lower surface of said printed circuit;

a through hole contact provided on said bottom member and having an outer diameter equal to or smaller than said inner diameter of said through hole, said through hole contact contacting an inner wall of said through hole only at a bottom part of said through hole; and a contact spring provided on said through hole contact and having a plurality of electrically conductive springs to receive a contact pin of said IC socket therein;

wherein overall length of said through hole contact and said contact spring is smaller than thickness of said printed circuit board such that said upper surface of said printed circuit board has no protruded portions of said pin socket connector.

2. A pin socket connector as defined in claim 1, wherein a conductive terminal is attached to a bottom surface of said bottom member.

3. A pin socket connector as defined in claim 1, wherein said through hole contact has a circular outer shape to snugly fit with said through hole having a circular inner shape.

4. A pin socket connector as defined in claim 1, wherein said bottom member, through hole contact and contact spring are integrally formed together.

5. A pin socket connector as defined in claim 1, wherein said bottom member, through hole contact and contact spring are separately formed and assembled together.

* * * * *